(12) United States Patent
Danley et al.

(10) Patent No.: US 6,515,244 B1
(45) Date of Patent: Feb. 4, 2003

(54) ACTUATOR HOUSING ISOLATOR PLATE

(75) Inventors: Brooks H Danley, El Paso, TX (US); Steven Douglas Thomson, El Paso, TX (US); Duane Zedric Collins, El Paso, TX (US); Paul Alfred Behrendsen, El Paso, TX (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 09/971,904

(22) Filed: Oct. 5, 2001

(51) Int. Cl.[7] .................................................. H01H 9/00

(52) U.S. Cl. ....................................... 200/296; 200/293

(58) Field of Search ................................. 200/292–296

(56) References Cited

U.S. PATENT DOCUMENTS

| | | | | |
|---|---|---|---|---|
| 4,458,123 A | * | 7/1984 | Hengesh et al. | ............ 200/294 |
| 4,621,373 A | * | 11/1986 | Hodsdon | ..................... 200/5 A |
| 6,028,770 A | * | 2/2000 | Kerner et al. | ............... 165/80.2 |
| 6,365,854 B1 | * | 4/2002 | Maattanen | ................... 200/333 |

* cited by examiner

*Primary Examiner*—Michael Friedhofer
(74) *Attorney, Agent, or Firm*—Margaret A. Dobrowitsky

(57) ABSTRACT

An actuator housing isolator plate is used in an actuator array having two or more actuator assemblies connected to each other by a flexible circuit. The isolator plate prevents the actuator housings, in which the actuator assemblies are disposed, from contacting the flexible circuit. Thus, the likelihood of the actuator housings shorting out the flexible circuit is eliminated. The isolator plate further includes isolator posts that prevent the flexible circuit from contacting itself when it is folded over on top of the actuator housings.

21 Claims, 1 Drawing Sheet

ACTUATOR HOUSING ISOLATOR PLATE

TECHNICAL FIELD

The present invention relates to motor vehicle sensors and actuators.

BACKGROUND OF THE INVENTION

Nearly every vehicle produced today, from light vehicles to heavy duty construction equipment, includes a plethora of sensors and actuators that monitor and control the operation of the vehicle. Some of these vehicles, e.g., heavy equipment, include arrays of actuators, i.e., two or more actuators, that are connected to each other via a flexible circuit. Unfortunately, the actuator housings can rub against the flexible circuit causing a short in the system.

It is possible to glue the flexible circuit to the tops of the actuator housings to prevent movement between the flexible circuit and the housings. However, the process to apply the glue is relatively messy and time consuming. It is also possible to include a second layer of protective plastic in the construction of the flexible circuit. This second layer, unfortunately, does not provide the required protection.

The present invention has recognized these prior art drawbacks, and has provided the below-disclosed solutions to one or more of the prior art deficiencies.

SUMMARY OF THE INVENTION

An actuator array includes an isolator plate and two or more actuator housings attached thereto. Each actuator housing includes an actuator assembly disposed therein, and each actuator assembly includes one terminal that extends through the isolator plate. The actuator array further includes a flexible circuit installed on the isolator plate opposite the actuator housings. The flexible circuit electrically connects the terminals. Moreover, the isolator plate separates the actuator housings from the flexible circuit.

In a preferred embodiment, the isolator plate includes a first actuator housing support section and a second actuator housing support section. The second section is connected to the first section by a first flexible rib and a second flexible rib. Preferably, each support section includes a peripheral stiffening rib and a central stiffening rib that extend therefrom.

In a preferred embodiment, the isolator plate further includes one or more isolator posts and two snap arms that extend from the isolator plate. Each actuator housing preferably forms two slots. The snap arms engage the slots in order to hold the actuator housings against the isolator plate. Preferably, the isolator plate includes a first connector end that extends from the isolator plate and a second connector end that extends from the isolator plate opposite the first connector end.

In another aspect of the present invention, an isolator plate for separating two or more actuator housings from a flexible circuit includes a first actuator housing support section and a second actuator housing support section that is connected to the first section by a flexible member.

In yet another aspect of the present invention, an actuator array includes two or more actuator housings that are attached to the isolator plate. Each actuator housing includes an actuator assembly that is disposed therein. Additionally, each actuator assembly includes a terminal that extends through the isolator plate. The actuator array also includes a flexible circuit that is installed on the isolator plate opposite the actuator housings. The flexible circuit electrically connects the terminals.

In this aspect, the actuator array further includes means for separating the actuator housings from the flexible circuit.

The present invention will now be described, by way of example, with reference to the accompanying drawings, in which:

DESCRIPTION OF AN EMBODIMENT OF THE INVENTION

Figure 1:
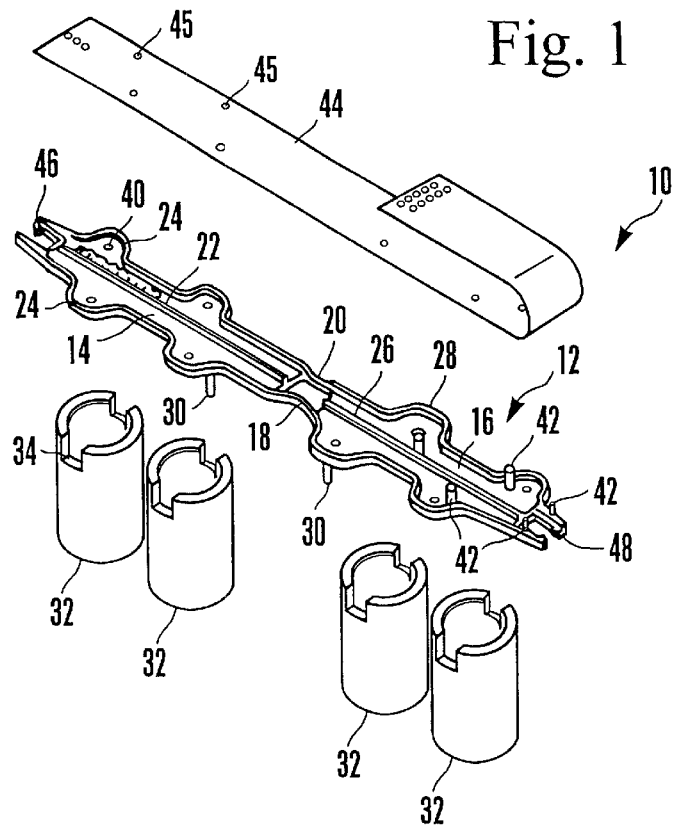
FIG. 1 is an exploded perspective view of an actuator array.
Figure 2:
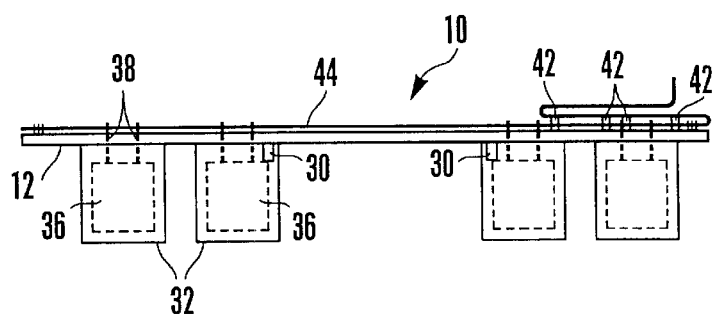
FIG. 2 is a side plan view of the actuator array.

Referring initially to FIGS. 1 and 2, an actuator array is shown and generally designated 10. FIGS. 1 and 2 show that the actuator array 10 includes an isolator plate 12. As shown, in a preferred embodiment, the isolator plate 12 includes a first actuator housing support section 14 and a second actuator housing support section 16. The first and second support sections 14, 16 are connected end-to-end by a first flexible rib 18 and a second flexible rib 20. The flexible ribs 18, 20 allow the isolator plate 12 to flex relative to each other in order to reduce the stress on the other components, described below, during a vibration condition.

As shown in FIG. 1, the first support section 14 includes a preferably straight first central stiffening rib 22 and a preferably partially straight, partially curved first peripheral stiffening rib 24 extending from the surface of the support section 14. Preferably, the first central stiffening rib 22 extends along the entire length of the first support section 14. FIG. 1 also shows that the second support section 16 includes a preferably straight second central stiffening rib 26 and a preferably partially straight, partially curved second peripheral stiffening rib 28 extending from the surface of the second support section 16. In a preferred embodiment, the second central stiffening rib 26 extends along the entire length of the second support section 16. Also, in a preferred embodiment, the stiffening ribs 22, 24, 26, 28 extend in both directions, i.e., above and below, from the surface of the support sections 14, 16.

FIG. 1 shows plural snap arms 30 extending downward from the support sections 14, 16. As shown in FIGS. 1 and 2, one or more, preferably four actuator housings 32 are attached to the isolator plate 12—two per each support section 14, 16. Each actuator housing 32 is formed with slots 34 near the top of the housing 32. The slots 34 are configured to snappingly engage the snap arms 30 in order to hold the isolator plate 12 tightly against the actuator housings 32.

FIG. 2 shows an actuator assembly 36 within each actuator housing 32. Each actuator assembly 36 includes at least two terminals 38 that extend from within the actuator housing 32 through correspondingly size and shaped holes 40 (FIG. 1) formed in the isolator plate 12.

As shown in FIGS. 1 and 2, the isolator plate 12 also includes plural isolator posts 42 extending from the surface of the isolator plate 12 opposite the snap arms 30. The actuator array 10 further includes a flexible circuit 44 that is installed along the top of the isolator plate 12 across the support sections 14, 16. The flexible circuit 44 is formed with plural terminal holes 45 that are configured to allow the actuator terminals 38 to pass therethrough. Moreover, the flexible circuit 44 is formed with plural isolator post holes (not shown) that allow the flexible circuit 44 to fit over the isolator posts 42. When the flexible circuit 44 is folded back over itself, as shown in FIGS. 1 and 2, the isolator posts 42 prevent the flexible circuit 44 from rubbing against itself.

Figure 3:
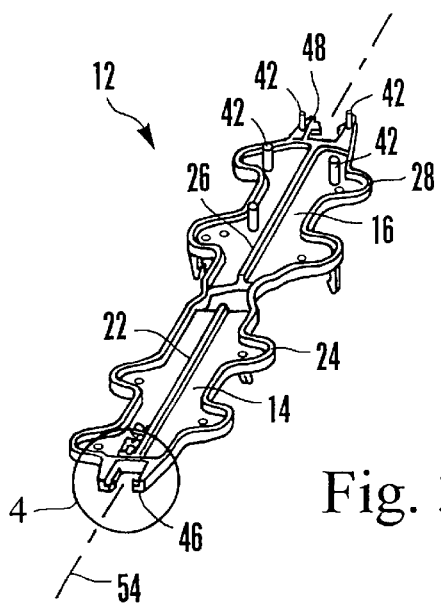
FIG. 3 is a perspective view of an isolator plate.

Referring now to FIGS. 1 and 3, the isolator plate 12 includes a first connector end 46 and second connector end 48. It is to be understood that the connector ends 46, 48 are identical, except that the second connector end 48 is flanked by a pair of isolator posts 42. The second connector end 48 includes the isolator posts 42 because the flexible circuit 44 is folded over at end 48. Thus, the isolator posts 42 prevent the flexible circuit 44 from contacting itself when it is folded as shown in FIG. 2.

Figure 4:
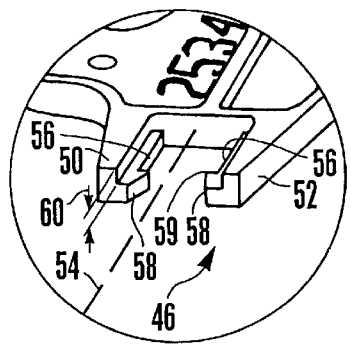
FIG. 4 is a detail view of the end of the isolator plate as indicated by circle 4 in FIG. 3.

FIG. 4 shows the details concerning the configuration of the first connector end 46. As shown, the first connector end 46 is generally "U" shaped and includes a first arm 50 and a second arm 52 extending from the isolator plate 12. The arms 50, 52 are parallel to each other and to a long axis 54 defined by the isolator plate 12. FIG. 4 shows that the arms 50, 52 are identical to each other. Each arm 50, 52 includes a rail 56 on which a correspondingly sized and shaped electrical connector (not shown) slides.

As shown, the end of each rail 56 forms a ramped surface 58 to facilitate installation of the connector on the connector end 46 of the isolator plate 12. Each rail 56 also forms a stop face 59 immediately adjacent to the ramped surface 58. The stop face 59 prevents the connector from sliding off the connector end 46. Moreover, each rail 56 is spaced a distance 60 from the top surface of the arm 50, 52 in order to properly align the connector with the isolator plate 12.

During assembly, a connector is snapped onto, e.g., the connector end 46 and then, terminals (not shown) formed by the connector are electrically connected to the flexible circuit 44. Thus, the flexible circuit 44 is connected to an external circuit (not shown) via the connector. It is to be appreciated that the configuration of the connector end 46 ensures that the connector has only one orientation relative to the isolator plate 12 during assembly.

With the configuration of structure described above, it is to be appreciated that the isolator plate 12 provides a means for preventing contact between the actuator housings 32 and the flexible circuit 44. Also, the isolator posts 42 prevent the flexible circuit 44 from contacting itself when it is folded onto itself after assembly. Thus, the risk of a short in the flexible circuit 44 caused by contact from the actuator housings 32 or the flexible circuit 44 itself is eliminated. The connector ends 46, 48 provide means for easing the attachment of connectors thereto. It is to be appreciated that the isolator plate 12 can be used to prevent contact between any housings that might contact a flexible circuit.

While the particular ACTUATOR HOUSING ISOLATOR PLATE as herein shown and described in detail is fully capable of attaining the above-described objects of the invention, it is to be understood that it is the presently preferred embodiment of the present invention and thus, is representative of the subject matter which is broadly contemplated by the present invention, that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural and functional equivalents to the elements of the above-described preferred embodiment that are known or later come to be known to those of ordinary skill in the art are expressly incorporated herein by reference and are intended to be encompassed by the present claims. Moreover, it is not necessary for a device or method to address each and every problem sought to be solved by the present invention, for it is to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. section 112, sixth paragraph, unless the element is expressly recited using the phrase "means for."

What is claimed is:

1. An actuator array, comprising:

an isolator plate;

at least two actuator housings attached to the isolator plate, each actuator housings having an actuator assembly disposed therein, each of the actuator assemblies having at least one terminal extending through the isolator plate; and at least one flexible circuit installed on the isolator plate opposite the actuator housings, the flexible circuit electrically connecting the terminals, the isolator plate separating the actuator housings from the flexible circuit.

2. The actuator array of claim 1, wherein the isolator plate includes:

at least a first actuator housing support section; and at least a second actuator housing support section connected to the first section by at least a first flexible rib and at least a second flexible rib.

3. The actuator array of claim 2, wherein the first support section includes:

at least one peripheral stiffening rib extending therefrom.

4. The actuator array of claim 3, wherein the second support section includes:

at least one peripheral stiffening rib extending therefrom.

5. The actuator array of claim 4, wherein the first support section further includes:

at least one central stiffening rib extending therefrom.

6. The actuator array of claim 5, wherein the second support section further includes at least one central stiffening rib extending therefrom.

7. The actuator array of claim 6, wherein the isolator plate further includes:

at least one isolator post extending therefrom.

8. The actuator array of claim 7, wherein the isolator plate includes at least two snap arms extending therefrom, and each actuator housing forms at least two slots, the snap arms engaging the slots in order to hold the actuator housings against the isolator plate.

9. The actuator array of claim 8, wherein the isolator plate includes at least a first connector end extending therefrom.

10. The actuator array of claim 9, wherein the isolator plate includes at least a second connector end extending therefrom opposite the first connector end.

11. An isolator plate for separating at least two actuator housings from a flexible circuit, comprising:

at least a first actuator housing support section; and at least a second actuator housing support section connected to the first section by at least a one flexible member.

12. The isolator plate of claim 11, wherein the first support section includes:
   at least one peripheral stiffening rib extending therefrom.

13. The isolator plate of claim 12, wherein the second support section includes:
   at least one peripheral stiffening rib extending therefrom.

14. The isolator plate of claim 13, wherein the first support section further includes:
   at least one central stiffening rib extending therefrom.

15. The isolator plate of claim 14, wherein the second support section further includes:
   at least one central stiffening rib extending therefrom.

16. The isolator plate of claim 15, further comprising:
   at least one isolator post extending therefrom.

17. The isolator plate of claim 16, further comprising:
   at least two snap arms extending therefrom, and each of the actuator housings forms at least two slots, the snap arms engaging the slots in order to hold the actuator housings against the isolator plate.

18. The isolator plate of claim 17, further comprising:
   at least a first connector end extending therefrom.

19. The isolator plate of claim 18, further comprising:
   at least a second connector end extending therefrom opposite the first connector end.

20. An actuator array, comprising:
   at least two actuator housings attached to the isolator plate,
   each of the actuator housings having an actuator assembly disposed therein,
   each of the actuator assemblies having at least one terminal extending through the isolator plate;
   at least one flexible circuit installed on the isolator plate opposite the actuator housings, the flexible circuit electrically connecting the terminals; and
   means for separating the actuator housings from the flexible circuit.

21. The actuator array of claim 20, wherein the flexible circuit is folded onto itself and the actuator array further comprises:
   means for preventing the flexible circuit from contacting itself.

* * * * *